United States Patent
Huang et al.

[11] Patent Number: 6,157,536
[45] Date of Patent: Dec. 5, 2000

[54] RETENTION MODULE FOR RECEIVING DIFFERENT CPU MODULES

[75] Inventors: Yao-Chi Huang, Yung-Ho; Jung-Chueh Hsu, Taiepi, both of Taiwan

[73] Assignee: Hon Hai Precision Ind. Co., Ltd., Taipei Hsien, Taiwan

[21] Appl. No.: 09/221,267

[22] Filed: Dec. 23, 1998

[30] Foreign Application Priority Data

May 8, 1998 [TW] Taiwan .................................. 87207128

[51] Int. Cl.[7] ................................ G06F 1/16; H05K 7/02
[52] U.S. Cl. ..................... 361/684; 361/801; 361/802; 361/740; 439/928.1
[58] Field of Search ..................... 361/683, 802, 361/759, 740, 756, 801, 684; 439/377, 327, 928.1; 710/102; 365/51, 52, 230.05

[56] References Cited

U.S. PATENT DOCUMENTS

| | | | |
|---|---|---|---|
| 3,829,741 | 8/1974 | Athey | 361/801 |
| 5,514,002 | 5/1996 | Cheng et al. | 439/326 |
| 5,726,865 | 3/1998 | Webb et al. | 361/801 |
| 5,829,601 | 11/1998 | Yurchenco et al. | 361/759 |
| 5,943,218 | 8/1999 | Liu | 361/683 |
| 6,008,995 | 12/1999 | Pusateri et al. | 361/802 |
| 6,030,251 | 2/2000 | Stark et al. | 439/377 |
| 6,038,131 | 3/2000 | Valosen et al. | 361/756 |
| 6,045,385 | 4/2000 | Kane | 439/327 |

*Primary Examiner*—Lynn D. Feild

[57] ABSTRACT

A retention module comprises a pair of first reception members each defining an inner channel formed by a vertical wall and a horizontal wall extending from the vertical wall for receiving a first CPU module. A pair of second reception members each comprise an engaging face fixed to a portion of the inner channel of one of the first reception members and a reception face opposite the engaging face for receiving an edge of a second CPU module which is shorter in length than the first CPU module.

11 Claims, 7 Drawing Sheets

RETENTION MODULE FOR RECEIVING DIFFERENT CPU MODULES

BACKGROUND OF THE INVENTION

1. Field of the Invention

The present invention relates to a retention module for receiving a CPU module, and especially to a retention module including a detachable portion which may be attached to or detached from the retention module for receiving different CPU modules of different size.

2. The Prior Art

A modularized PC board or CPU card has become a trend in the PC industry. Traditionally, the CPU is connected to a mother board either via a connector or direct soldering. However, an advanced manufacturing technique has replaced this by firstly soldering the CPU onto a printed circuit board and then inserting the printed circuit board into a connector mounted on the mother board. Alternatively, the CPU is firstly combined with the PC board as a modularized unit and then inserted into a connector mounted on the mother board. Recently, the modularized CPU unit has become a trend and named "SLOT 1". Normally the modularized CPU unit is connected to a card connector which is further retained by a retention module. The retention module may be classified into vertical, horizontal, or coplanar types.

FIG. 1 illustrates a vertical retention module 61 mounted on a printed circuit board 62 for vertical insertion of a CPU module (not shown). A closure portion 61C is formed at a lower portion of the retention module 61 for receiving a card connector (not shown) which is well known to electrically receive the CPU module. FIG. 2 illustrates a horizontal retention module 63 laterally mounted on a printed circuit board 64 and a card connector 65 fixed in the retention module 63 for electrically receiving a CPU module. A CPU module (not shown) may be inserted into the card connector 65 and retained between two arms of the retention module 63. FIG. 3 illustrates a coplanar retention module 66 having one mating face for receiving an edge of a printed circuit board 67 and another mating surface for receiving a CPU module (not shown). Each type of retention module may receive a specific kind of CPU module, but none of the retention module can accommodate CPU modules of different size.

There are at least two types of popular CPU modules, the Pentium™ II SECC™ and the Pentium™ II Celeron™. The Pentium™ II SECC™ is rather thick because the related circuit board is enclosed by a plastic housing as designated by numeral 7 in FIG. 6. Also referring to FIG. 7, the Pentium™ II Celeron™ includes a circuit board 8 and a heat sink 9 attached to a CPU chip of the circuit board 8 thus the combination includes two spaced-apart plates, the circuit board 8 and the heat sink 9, with a CPU chip (not shown) provided therebetween. Since the SECC™ CPU module is wider than the Celeron™ CPU module and the engaging sides thereof are also different from those of the Celeron™ CPU module, a single retention module cannot be used for both. Hence, it is requisite to provide a new retention module which can accommodate both types of CPU modules.

SUMMARY OF THE INVENTION

The primary purpose of the present invention is to provide a new retention module which can accommodate CPU modules of different size.

In accordance with one aspect of the present invention, a retention module comprises a pair of first reception members each defining an inner channel formed by a vertical wall and a horizontal wall extending from the vertical wall for receiving a first CPU module. A pair of second reception members each comprise an engaging face fixed to a portion of the inner channel of one of the first reception members and a reception face opposite the engaging face for receiving an edge of a second CPU module which is shorter in length than the first CPU module.

These and additional objectives, features, and advantages of the present invention will become apparent after reading the following detailed description of the preferred embodiment taken in conjunction with the appended drawing figures.

DETAILED DESCRIPTION OF THE PREFERRED EMBODIMENT

Figure 1:
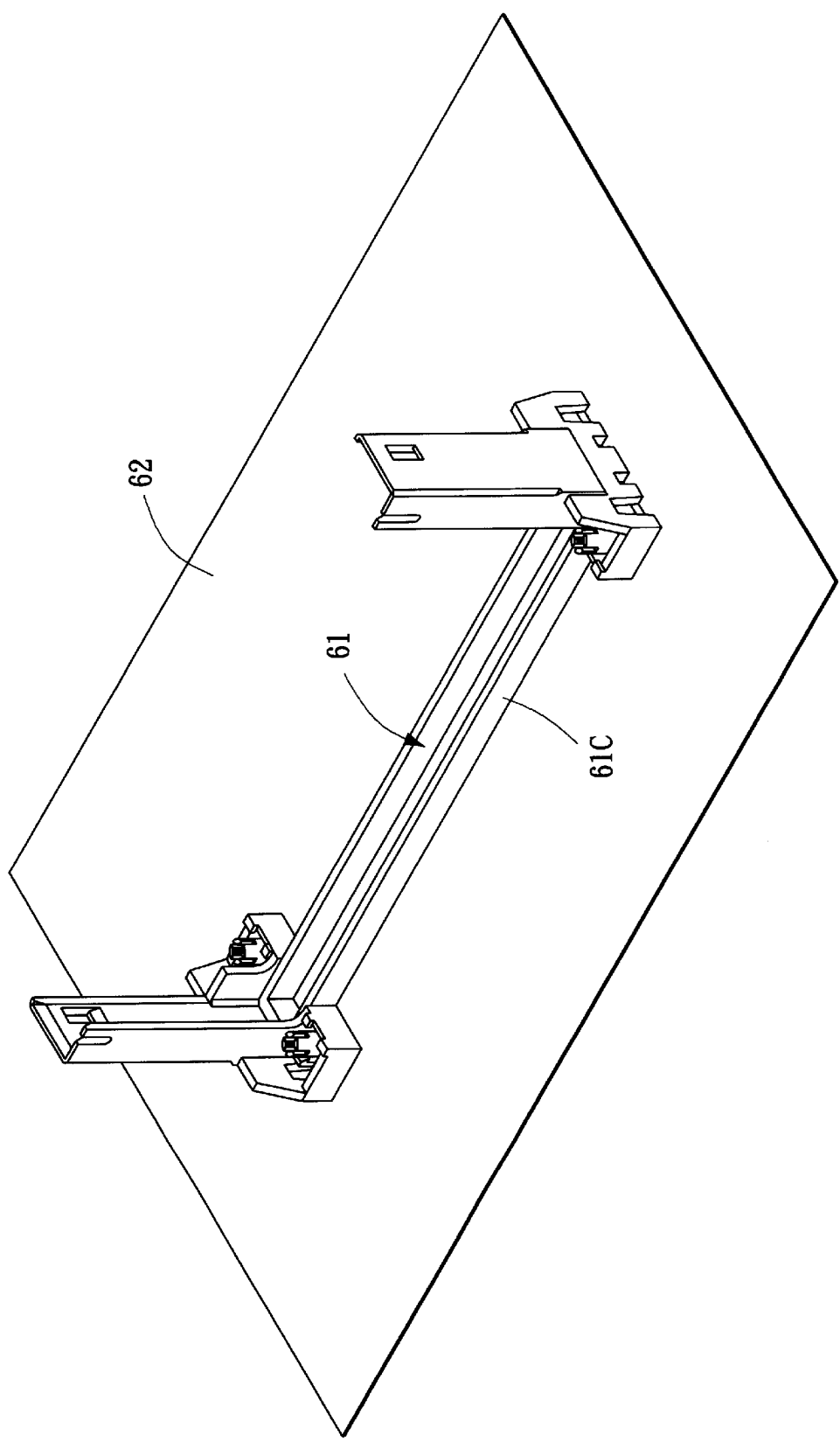
FIG. 1 is a conventional vertical-type retention module.
Figure 2:
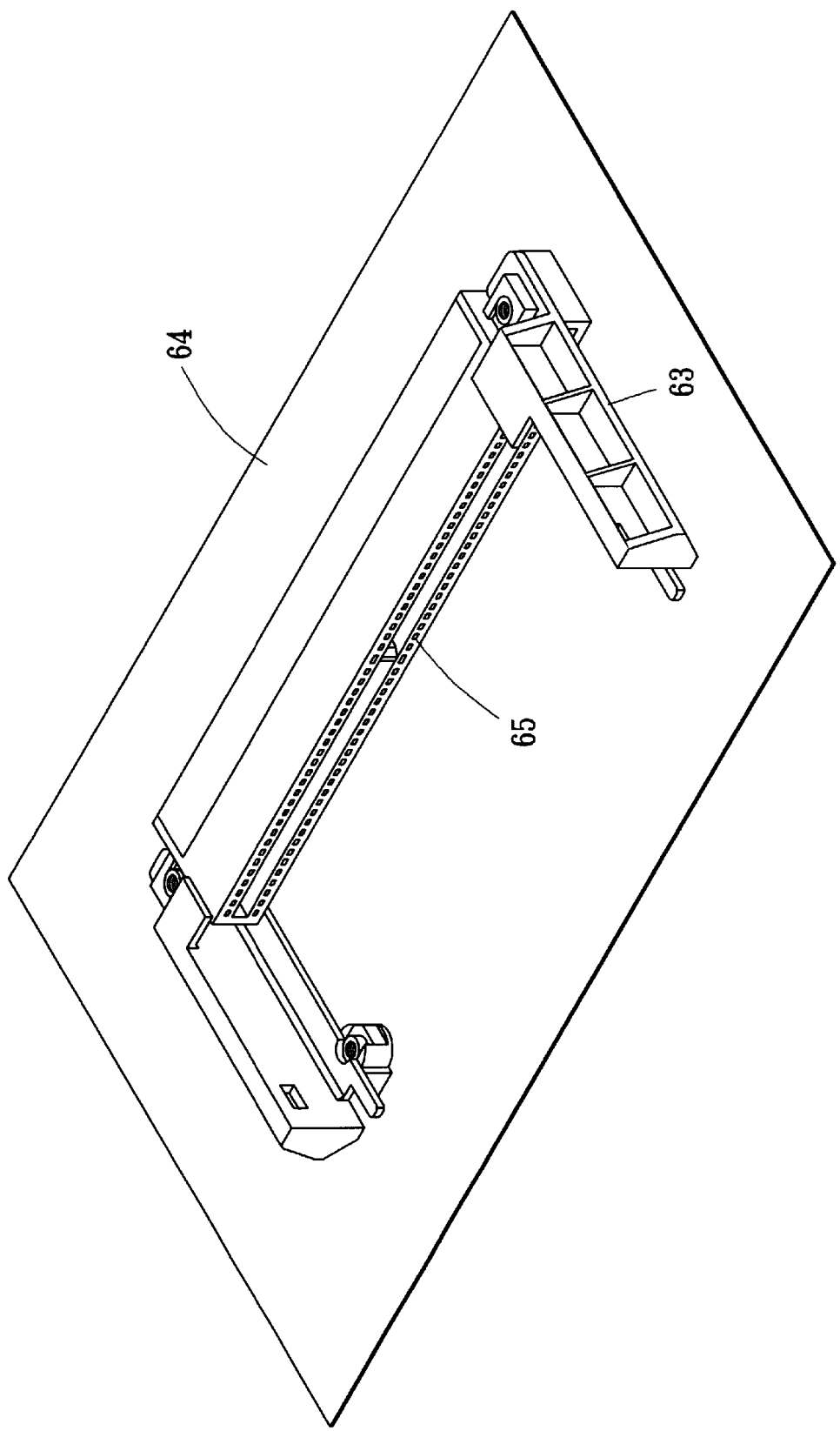
FIG. 2 is a conventional horizontal-type retention module.
Figure 3:
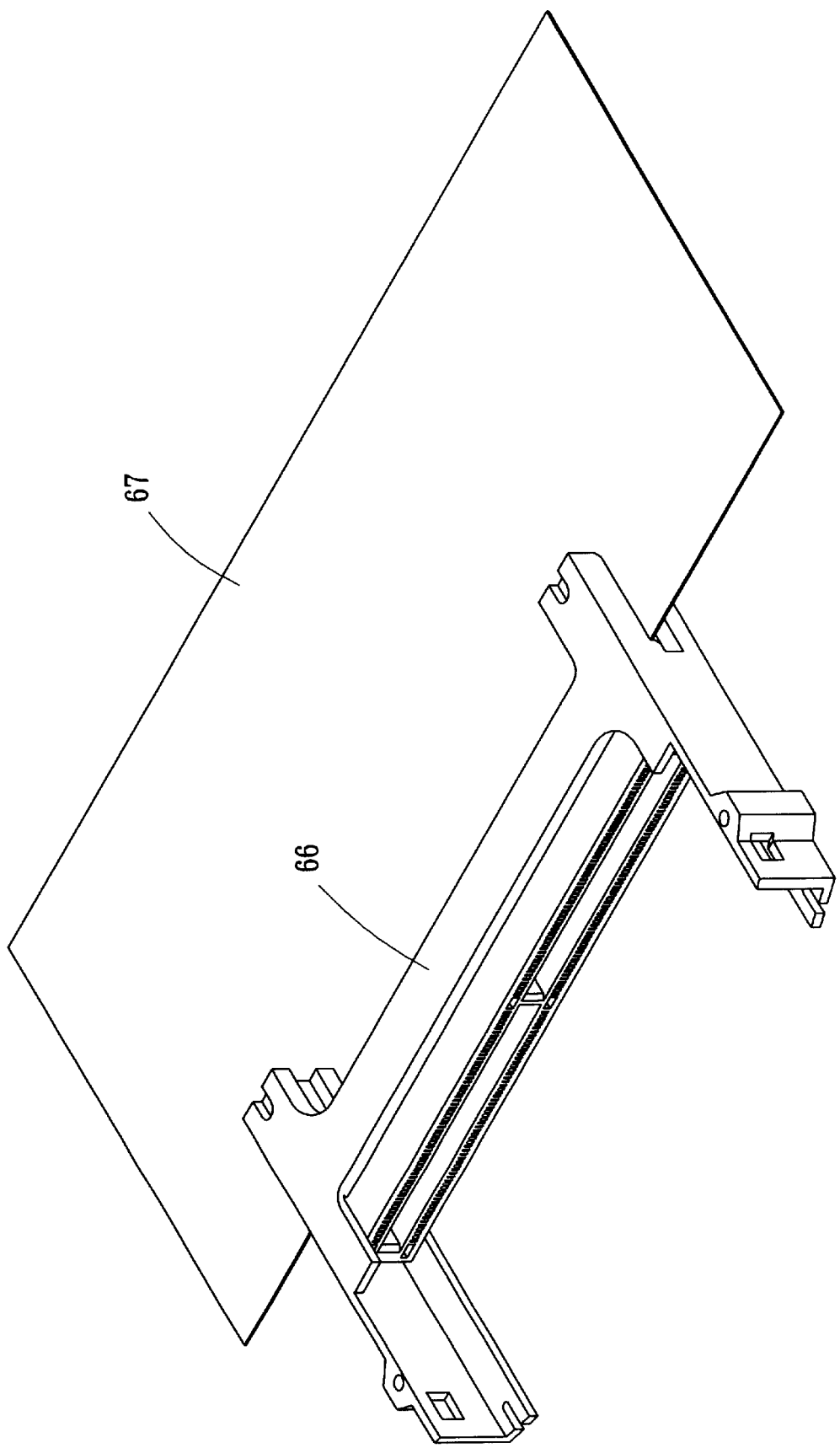
FIG. 3 is a conventional coplanar-type retention module.
Figure 4:
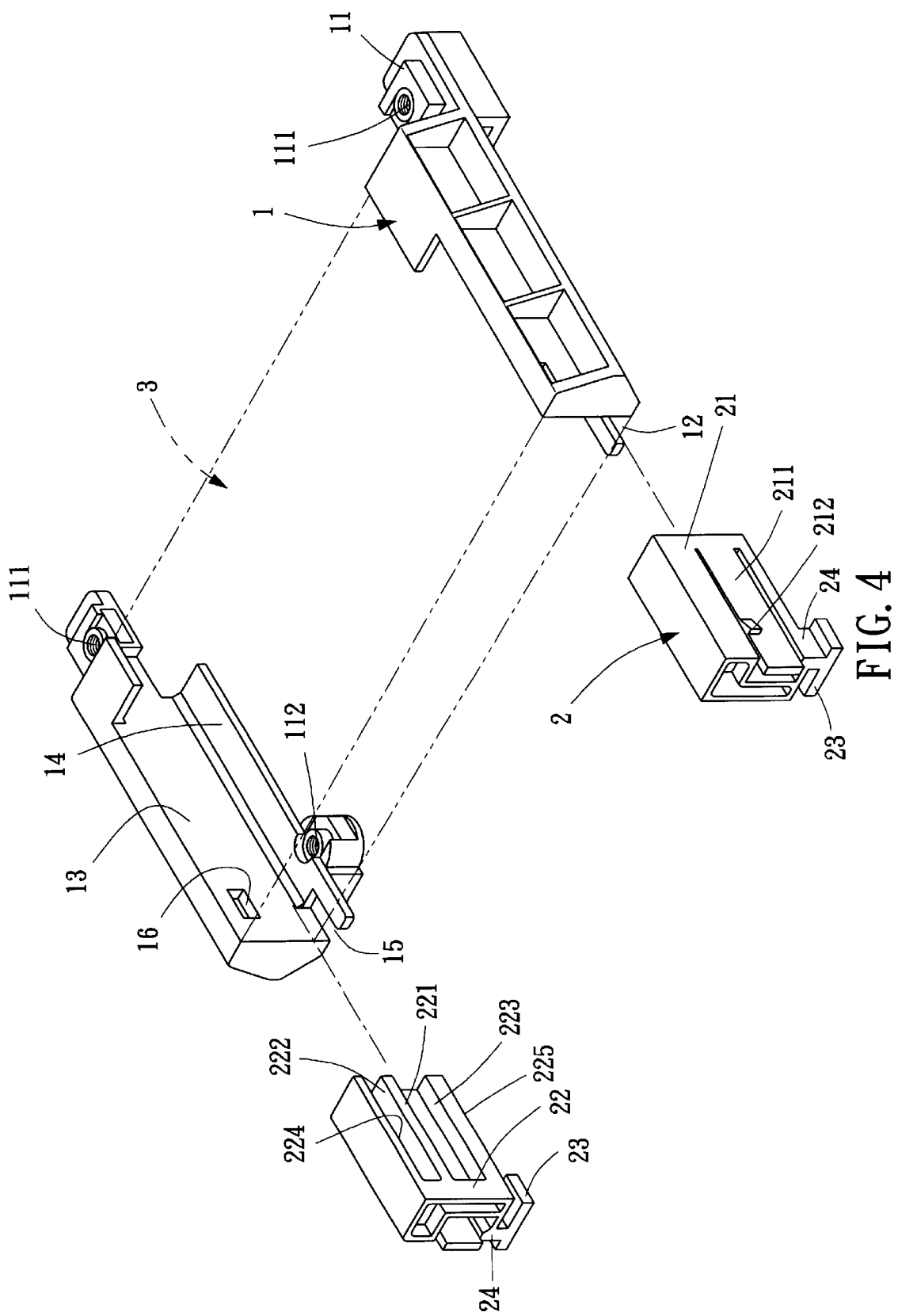
FIG. 4 is an exploded view of a retention module in accordance with the present invention.
Figure 6:
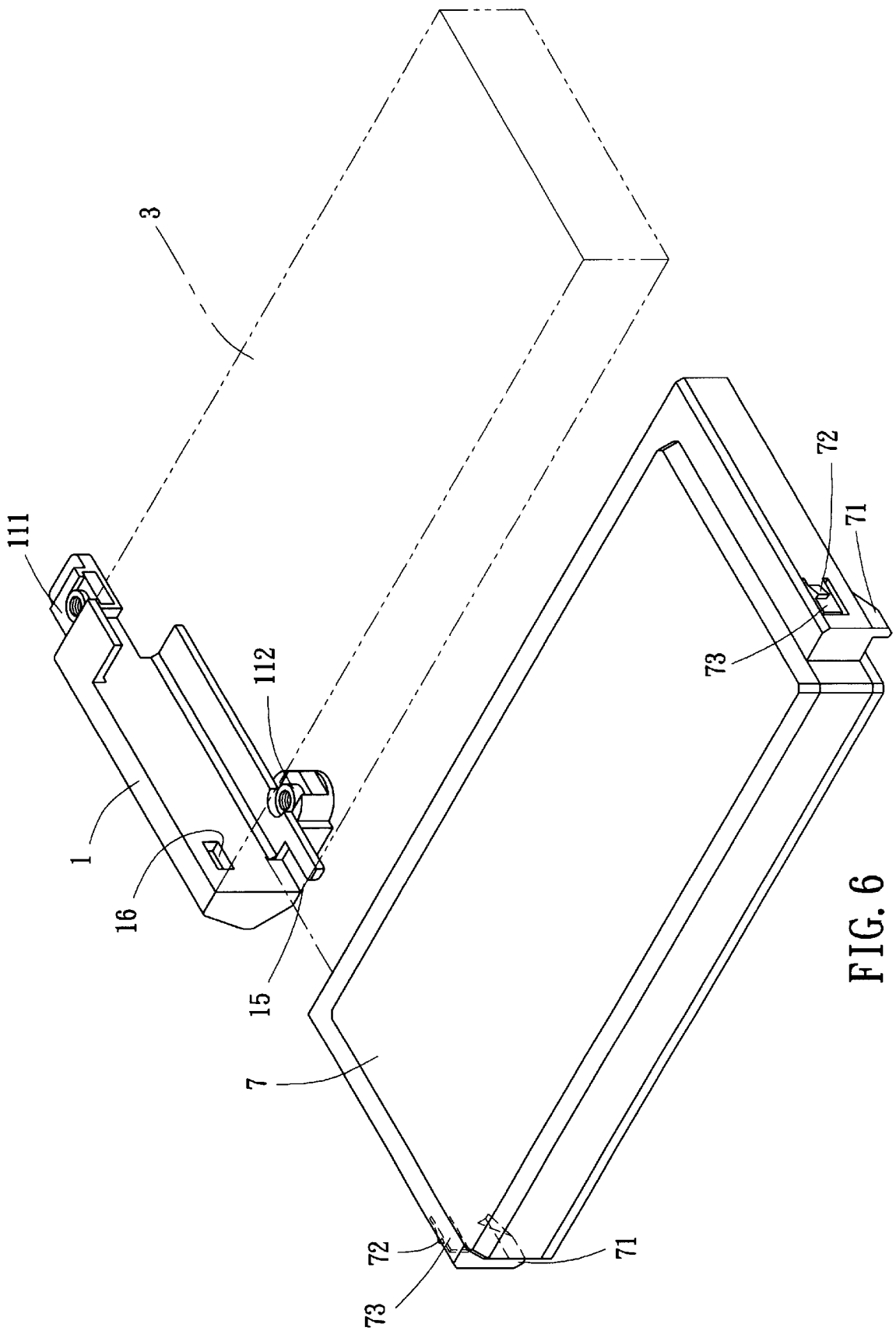
FIG. 6 shows half of the retention module of FIG. 4 and a CPU module adapted to be received therein.

Referring to FIG. 4, a retention module in accordance with the present invention comprises a pair of first reception members 1 and a pair of second reception members 2 adapted to be received in the first reception members 1. Each first reception member 1 is an elongate frame having a fixing end 11 including a first engagement socket 111 for fixing to a printed circuit board (not shown) and an inserting end 12 for receiving a CPU module 7 (FIG. 6). A connector (not shown) identical to the connector 65 shown in FIG. 2 is connected between the fixing ends 11 of the first reception members 1 for electrically engaging with a CPU module. Each first reception member 1 has an inner face 13 and a flange 14 extending from a lower edge of the inner face 13 thereby together defining a channel for guiding insertion of the CPU module. A hole 16 is defined in the inner face 13 near the inserting end 12. A cutout 15 is defined in the flange 14 at the inserting end 12. A second engagement socket 112 is formed under the flange 14 near the fixing end 12 for fixing the fixing end 12 to the printed circuit board.

Figure 7:
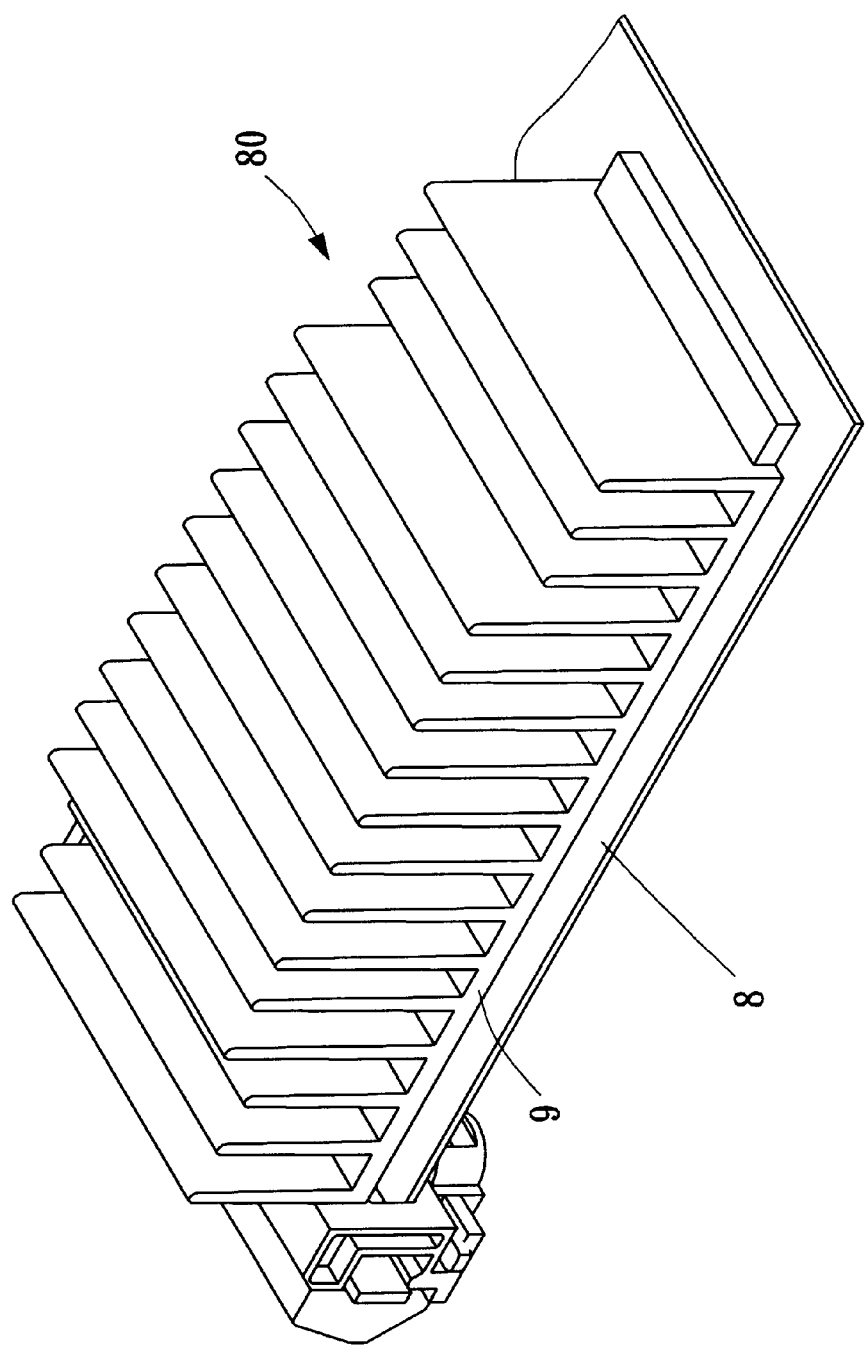
FIG. 7 shows a CPU module and a heat sink received in half of the retention module of FIG. 4.

Also referring to FIG. 6, the first reception members 1 are fixed to the printed circuit board by screws (not shown) and spaced apart from each other a specific distance thereby defining a first reception space 3 therebetween for receiving the SECC™ CPU module 7. Specifically, the SECC™ CPU module 7 has a pair of tabs 71 extending downward for engaging with the cutouts 15. A barb 72 is formed on an elastic tab 73 on each lateral end of the CPU module 7 for engaging within the corresponding hole 16 of the reception member 1. When the SECC™ CPU module 7 is disengaged from the combination of the related connector and the retention module and replaced by a Celeron™ CPU module 80 (FIG. 7), large gaps will exist between the retention module and the Celeron™ CPU module 80. Therefore, the second reception members 2 are used to compensate for the gaps.

Still referring to FIG. 4, the second reception member 2 is a rectangular body including an engaging face 21 and a reception face 22 opposite the engaging face 21. The second reception member 2 functions as an auxiliary retention means for fixing the Celeron™ CPU module in the same retention module which can directly receive the SECC™ CPU module 7 as shown in FIG. 6. A first rib 224, a second rib 221 and a third rib 225 are formed on the reception face 22 thereby defining a first recess 222 and a second recess 223 therebetween for receiving edges of the heat sink 9 and the printed circuit board 8 of the Celeron™ CPU module 80 when inserted into the first reception members 1. An elastic plate 211 is formed on the engaging face 21 substantially coplanar therewith. A barb 212 is formed on the elastic plate 211 for engaging within the hole 16 of the first reception member 1 when the second reception member 2 is inserted into the channel of the first reception member 1. A neck 24 extends downward from a bottom of the second reception member 2 substantially coplanar with the engaging face 21, and a beam 23 is integrally formed with and substantially perpendicular to the neck 24.

Figure 5:
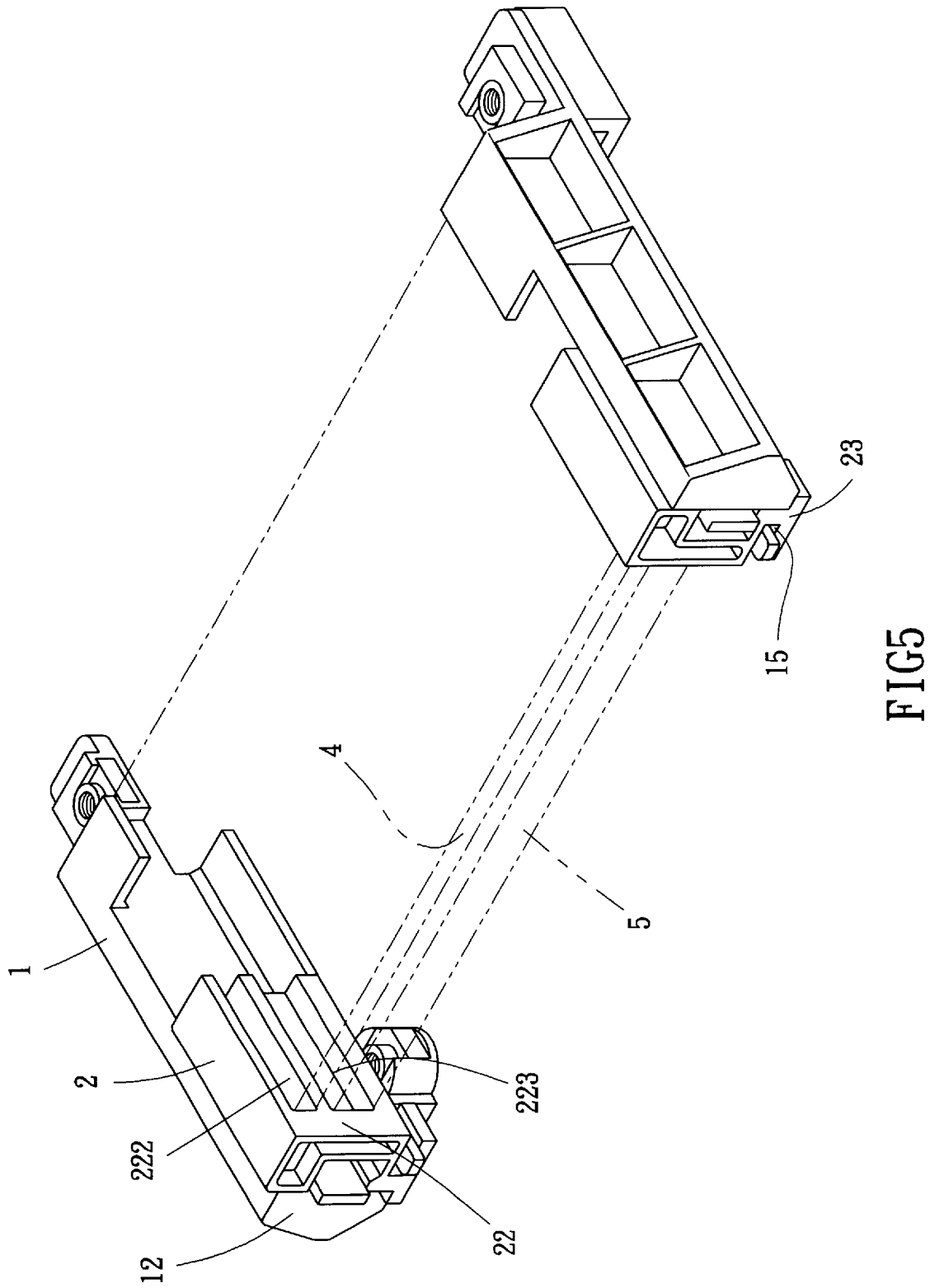
FIG. 5 is an assembled view of FIG. 4.

As shown in FIG. 5, the neck 24 is received in the cutout 15 of the first reception member 1 and the beam 23 abuts against a bottom portion of the first reception member 1 when the second reception member 2 is inserted into the channel of the first reception member 1 to compensate for the gaps between the Celeron™ CPU module 80 (FIG. 7) and the first reception members 1. An upper reception space 4 and a lower reception space 5 defined between the reception members 1, 2 are used to receive the Celeron™ CPU module 80.

It should be noted that the second reception members not: only provides recesses for holding the heat sink 9 and the printed circuit board 8 of the Celeron™ CPU module 80 in position, but also provides means to abut against the edge of the printed circuit board 8 (FIG. 7) for preventing withdrawal of the Celeron™ CPU module 80 therefrom.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A retention module comprising:
    a pair of first reception members each defining an inner channel formed by a vertical wall and a horizontal wall extending from the vertical wall for receiving a first CPU module, each first reception member defining a hole in the vertical wall of the inner channel; and
    a pair of second reception members each comprising an engaging face fixed to a portion of the inner channel of one of the first reception members and a reception face opposite the engaging face for receiving an edge of a second CPU module which is significantly different from the first CPU module on external dimensions;
    wherein each second reception member has an elastic plate formed on the engaging face thereof and a barb extending from the elastic plate for engaging within the hole of the first reception member.

2. The retention module as claimed in claim 1, wherein each first reception member defines a cutout in the horizontal wall of the inner channel.

3. The retention module as claimed in claim 1, wherein each engaging face has a neck extending downward therefrom integrally formed with a beam perpendicular to the neck whereby the neck is received in the cutout of the first reception member and the beam abuts against a bottom surface of the first reception member when the second reception member is fixed to the first reception member.

4. The retention module as claimed in claim 2, wherein each second reception member has a plurality of ribs formed on the reception face thereof thereby defining a plurality of recesses for respectively receiving a corresponding edge of the second CPU module.

5. A method of alternatively retaining first and second CPU modules, comprising steps of:
    providing a pair of first reception members each defining a relatively thicker channel therein, respectively;
    providing a locking hole in each of the first reception members;
    providing a pair of second reception members optionally detachably attached to said pair of first reception members, respectively, each defining at least one relatively thinner recess therein; and
    providing a barb on each of said second reception members for releasable engagement within the corresponding locking hole of the first reception member; whereby the retention module can either receivably retain therein a first CPU module having a relatively larger thickness thereof by means that the first CPU is received within the channels and a barb of the first CPU module is latchably retained within the corresponding locking hole of each of the first reception members without the second reception members being involved therein, or receivably retain therein a second CPU module having a relatively smaller thickness thereof by means that the second reception members are assembled to the first reception members by means of respective engagement of said barbs of the second reception members within the corresponding locking holes of the first reception members, and the second CPU is snugly retainably received within the recesses of the second reception members.

6. The method as claimed in claim 5, further comprising a step of providing another thinner recess in each of said second reception members for retaining a heat sink which is associated with the second CPU module.

7. A retention module comprising:
    a pair of opposite first reception members each defining a relatively thicker channel and a locking hole therein; and
    a pair of opposite second reception members each defining a first relatively thinner recess therein and including a barb thereon so as to optionally attach each of said second reception members to the corresponding first reception member; whereby
    the retention module can receivably retain a first CPU module having a relatively larger thickness by means that the first CPU module is retainably received within the channels of the first reception members by engagement of barbs of the CPU module within the locking holes of the first reception members without the second reception members being involved therein; alternatively, the retention module can receivably retain the second CPU module having a relatively smaller thickness by means that the second reception members are assembled to the corresponding first reception members by engagement between the barbs of the second reception members and the corresponding locking holes of the first reception members, and the second CPU module can be retainably received within the recesses of the second reception members, wherein said first CPU module and said second CPU module are mutually exclusively received within the retention module;

wherein each of second reception members further defines a second recess so that the first recess receives a printed circuit board of the second CPU module and the second recess receives a heat sink associated therewith.

8. The retention module as claimed in claim 7, wherein said second reception members can be received within the channels of the first reception members, respectively, when assembled.

9. An arrangement of alternatively retaining a first thicker CPU module and a second thinner CPU module in position, comprising:

a pair of first reception members each defining a relatively thicker channel therein;

a pair of second reception members each defining at least a relatively thinner recess therein and adapted to he releasably attached to the corresponding first reception member; whereby the first thicker CPU module can be retainably received within the thicker channels of the first reception members; and the second thinner CPU module can be received within the thinner recesses of the second reception members when the second reception members are assembled to the corresponding first reception members, wherein said first CPU and said second CPU are mutually exclusively positioned between said first reception members.

10. A retention module comprising:

a pair of first reception members each defining an inner channel formed by a vertical wall and a horizontal wall extending from the vertical wall for receiving a first CPU module; and a pair of second reception members each comprising an engaging face fixed to a portion of the inner channel of one of the first reception members and a reception face opposite the engaging face defining a recess parallel to the channel of the first reception member for receiving an edge of a second CPU module which is significantly different in its external dimensions from the first CPU module.

11. The retention module as claimed in claim 10, wherein the reception faces are spaced from each other a distance which is shorter than a distance between the vertical walls of the first reception members.

* * * * *